United States Patent [19]
Murata

[11] Patent Number: 5,929,677
[45] Date of Patent: Jul. 27, 1999

[54] PHASE LOCKED LOOP HAVING A VOLTAGE SOURCE RESPONSIVE TO A FILTERED PHASE DIFFERENCE OUTPUT VOLTAGE AND SEMICONDUCTOR DEVICE INCLUDING THE PHASE LOCKED LOOP

[75] Inventor: Toshihiko Murata, Kawasaki, Japan

[73] Assignee: Fujitsu Limited, Kawasaki, Japan

[21] Appl. No.: 08/658,622

[22] Filed: Jun. 5, 1996

[30] Foreign Application Priority Data

Sep. 20, 1995 [JP] Japan ................................. 7-241386

[51] Int. Cl.⁶ ............................ H03K 5/13; H03K 5/00
[52] U.S. Cl. ..................... 327/157; 327/156; 327/147; 327/148; 331/17
[58] Field of Search ................................. 327/147, 148, 327/156, 157, 141, 3, 536; 331/17, 8

[56] References Cited

U.S. PATENT DOCUMENTS

| | | | |
|---|---|---|---|
| 4,885,554 | 12/1989 | Wimmer | 327/157 |
| 5,170,130 | 12/1992 | Ichihara | 331/17 |
| 5,475,326 | 12/1995 | Masuda | 331/17 |

*Primary Examiner*—Dinh Le
*Attorney, Agent, or Firm*—Armstrong, Westerman, Hattori, McLeland & Naughton

[57] ABSTRACT

A phase locked loop having a charging pump circuit portion for generating a phase difference output voltage between an input signal and an oscillation output signal, and a semiconductor device including such a phase locked loop, are constituted so that the phase difference output signal from the charging pump circuit portion is inputted to a voltage controlled oscillator through a low-pass filter, and an oscillation frequency of the oscillation output signal from the voltage controlled oscillator is brought into conformity with a frequency of the input signal, and they further include voltage source means which is connected to a phase difference output terminal of the charging pump circuit portion during each period in which the phase difference output terminal of the charging pump circuit portion is in a non-conductive state, and supplies a voltage having a potential substantially equal to the potential of the low-pass filter on the output side thereof.

8 Claims, 14 Drawing Sheets

PHASE LOCKED LOOP HAVING A VOLTAGE SOURCE RESPONSIVE TO A FILTERED PHASE DIFFERENCE OUTPUT VOLTAGE AND SEMICONDUCTOR DEVICE INCLUDING THE PHASE LOCKED LOOP

BACKGROUND OF THE INVENTION

1. Field of the Invention

This invention relates to a phase locked loop including, as principal constituent elements, a phase comparator, charging pump circuit, a low-band filter (which is also referred to as a "low-pass filter"), a voltage controlled oscillator (which is generally abbreviated to "VCO") and a frequency divider, and having a function of causing the frequency of an oscillation output signal to conform to the frequency of an input signal by changing an output voltage in accordance with the phase difference between the input signal and the oscillation output signal from the voltage controlled oscillator (or from the frequency divider), and relates also to a semiconductor device in which the phase locked loop containing the constituent elements described above is formed on one chip and integrated into this chip. Such a phase locked loop is generally referred to as "PLL", and is used for portable telephone sets and so forth.

More particularly, the present invention relates to an improvement in the linearity of the output voltage characteristics of a charging pump circuit portion for generating an analog phase difference output voltage on the basis of a digital phase difference signal representing the phase difference between an input signal outputted from a phase comparator and an oscillation output signal, and for inputting the analog phase difference output voltage into a low-pass filter (Hereinafter, the term "charging pump circuit portion" will be used in the sense that that circuit constitutes a part of the PLL.).

2. Description of the Related Art

First, the construction of a phase locked loop according to the prior art and its operating characteristics will be explained in order to make the problems concerning the conventional phase locked loop more easily understood, with reference to FIGS. 1 to 5.

FIG. 1 is a block circuit diagram showing the construction of the phase locked loop according to the prior art, wherein, however, the construction of the phase locked loop is illustrated in a simplified form so as to simplify the explanation.

As shown in FIG. 1, the phase locked loop 10 generally includes a phase comparator 2, a charging pump circuit portion 30, a low-pass filter 60, a voltage controlled oscillator (VCO) 8 and a frequency divider 9, and these constituent elements constitute a control circuit for a loop system.

In FIG. 1, the phase comparator 2 enables the phases of an input signal Sr and an oscillation output signal Sv to conform to the phase of a reference signal (for example, a clock signal) so as to compare the phase difference between the digital input signal Sr and the oscillation output signal Sv (or a phase locked signal So) of the voltage controlled oscillator 8 (or the frequency divider 9), for example.

After phase alignment is effected in this way, two kinds of phase difference comparison signals outputted from the phase comparator 2 are inputted to a charging pump circuit portion 30. In this charging pump circuit portion 30, a first transistor TR1 comprising a P-channel field effect transistor (P-channel FET), etc., and a second transistor TR2 comprising an N-channel field effect transistor (N-channel FET), etc., are connected with each other, in a push-pull manner, between a positive terminal of a power supply voltage Vd and a negative terminal of a power supply voltage —Vd. The two kinds of phase difference comparison signals described above are inputted to the gates of the first and second transistors TR1 and TR2, respectively, and are outputted as a phase difference output voltage from the junction of these transistors TR1 and TR2.

Further, the phase difference output voltage from the charging pump circuit portion 30 is inputted to a low-pass filter 60 which is also referred to as a "loop filter". This low-pass filter 60 constitutes an integration circuit including two resistors R1 and R2 and one capacitor C1, and has a function of smoothing the phase difference output voltage from the charging pump circuit portion 30.

The output voltage smoothed by the low-pass filter 60 has a voltage value corresponding to the phase difference. Therefore, when the smoothed output voltage is inputted to the voltage controlled oscillator 8 through a capacitor 65 provided for noise elimination, etc., an oscillation output signal Sv having an oscillation frequency corresponding to the phase difference is outputted from the voltage controlled oscillator 8. This oscillation output signal Sv is inputted, either directly to the phase comparator, or is inputted to the phase comparator 2 after the oscillation frequency is suitably regulated through the frequency divider 9. In other words, in the case of this example, the charging pump circuit portion 30 and the voltage controlled oscillator 8 operate so as to cause the oscillation frequency of the oscillation output signal Sv to conform to the frequency of the input signal Sr in accordance with the phase difference and in this way, the phase of the phase locked signal So as the final output of the phase locked loop 10 is locked.

In the phase locked loop 10 including the charging pump circuit portion 30 as shown in FIG. 1, the phase locked loop can be constituted by a simple circuit construction by utilizing a simple switch operation of the transistors, etc., inside the charging pump circuit portion. According to the phase locked loop of this kind, an output voltage having good linearity can be generated by the low-pass filter 60, ideally within the range of the phase difference of from $+\pi$ radian (rad) to $-\pi$ radian (including both of the leading phase and the lagging phase).

In the phase locked loop 10, however, a stray capacity Cs usually exists at the circuit portions disposed at the back of the output terminal of the charging pump circuit portion 30, e.g., in a portion of a wiring pattern. Therefore, ideal output voltage characteristics cannot be obtained in which the phase difference is in the proximity of 0 radian, owing to an influence of this stray capacity Cs. In consequence, the phase locked loop 10 has greatly different output voltage characteristics between the above portions in which the phase difference is in the proximity of 0 radian and portions having other phase differences. Particularly when the resistance values of the two resistors R1 and R2 in the low-pass filter 60 increase (up to values not smaller than 100 kilo-ohms (k$\Omega$), for example) and an impedance of the low-pass filter 60 increases, the influence of the stray capacity Cs becomes larger, and the output voltage characteristics near the phase difference of 0 (zero) radian (that is, the phase lock characteristics) tend to become remarkably different from characteristics obtained by theoretical calculations. As a result, the phase lock characteristics of the phase locked loop 10 become unstable.

As described above, in the phase locked loop according to the prior art, a charge is accumulated in the stray capacity Cs existing at the circuit portions after the output terminal of the charging pump circuit portion 30 near the phase difference of 0 radian, and even when the charging pump circuit portion 30 stops outputting a voltage, electric charges accumulated in the stray capacity Cs flow into the low-pass filter 60. The state in which the charges flow into the low-pass filter 60 is inverted between the leading phase and the lagging phase, so that an extremely large change of the output level occurs near the phase difference of 0 radian. The mode of the change of the phase difference output voltage of the charging pump circuit portion 30, corresponding to the output voltage of the low-pass filter 60 near the phase difference of 0 radian, will be further explained with reference to FIGS. 2 to 5.

FIG. 2 is a timing chart useful for explaining an operation of the charging pump circuit portion according to the prior art near the phase difference of 0 radian and in the leading phase; FIG. 3 is a timing chart useful for explaining an operation of the charging pump circuit portion according to the prior art near the phase difference of 0 radian and in the lagging phase; and FIG. 4 is a timing chart useful for explaining an operation of the charging pump circuit portion according to the prior art almost exactly at the phase difference of 0 radian.

FIG. 2 shows the case where the phase difference between a digital input signal Sr ("L" (Low) level or "H" (High) level) and the oscillation output signal Sv is approximately zero (0 radian) and the phase of the oscillation output signal Sv is slightly ahead of the phase of the input signal Sr (the case of the leading phase).

In this case, the second transistor TR2 is turned ON (conductive state) for each period corresponding to the phase difference generated due to the difference between times of leading edges from the "L" level to the "H" level of the input signal Sr and the oscillation output signal Sv, and a negative phase difference output voltage is outputted from the charging pump circuit portion 30. Both the first and second transistors TR1 and TR2 are turned OFF (non-conductive state) for other periods, and the phase difference output voltage from the charging pump circuit portion 30 should become 0 (zero). However, as described above, after the phase difference output voltage from the charging pump circuit portion 30 changes to 0, the electric charges accumulated in the stray capacity Cs flow into the lowpass filter 60 in the portion in which the phase difference is in the proximity of 0. Since these charges flowing into the low-pass filter 60 are discharged through the resistors inside the low-pass filter 60, the time required before the negative phase difference output signal returns to 0 becomes relatively long.

FIG. 3 shows the case in which the phase difference between the digital input signal Sr and the oscillation output signal Sv is approximately 0 and the phase of the oscillation output signal Sv is slightly behind the phase of the input signal Sr (in the case of the lagging phase).

In this case, the first transistor TR1 is turned ON for each period corresponding to the phase difference generated due to the difference between times of leading edges from the "L" level to the "H" level of the input signal Sr and the oscillation output signal Sv, and a positive phase difference output voltage is outputted from the charging pump circuit portion 30. Both the first and second transistors TR1 and TR2 are turned OFF for other periods, and the phase difference output voltage from the charging pump circuit portion 30 should become 0. However, in this case too, the charges flowing into the low-pass filter 60 are discharged through the resistors inside the low-pass filter 60, so that the time required before the positive phase difference output voltage returns to 0 becomes relatively long.

FIG. 4 shows the case in which the phase difference between the digital input signal Sr and the oscillation output signal Sv is almost exactly 0 and the phase is only slightly the lagging phase or only slightly the leading phase.

In this case, the phase difference generated due to the difference between times of leading edges from the "L" level to the "H" level of the input signal Sv and the oscillation output signal Sv is substantially 0. Therefore, both the first and second transistors TR1 and TR2 are turned OFF for all the periods, and the phase difference output voltage from the charging pump circuit portion 30 should remain at 0. However, in this case, too, the charges accumulated in the stray capacity Cs during only the slight period of the lagging phase or the leading phase flow into the low-pass filter 60 and are discharged through the resistors inside the low-pass filter 60. In consequence, in both of the cases in which the phase is only slightly the lagging phase and in which it is only slightly the leading phase as shown in FIG. 4, a positive pulse-like voltage and a negative pulse-like voltage are generated, respectively.

Since the polarity of the charges accumulated in the stray capacity Cs is inverted between the leading phase and the lagging phase, an extremely large change of the output level occurs on the output side of the charging pump circuit portion 30 in the portion where the phase difference is in the proximity of 0 radian. As a result, the output voltage smoothed by the low-pass filter 60 abruptly changes near the phase difference of 0 radian as represented by the graph of FIG. 5. In other words, linearity in the phase locked loop with respect to the change of the phase difference is impeded by an influence of the stray capacity Cs near the phase difference of 0 radian.

In the explanation given above, the case in which the phase difference output voltage is 0, when the phase difference is 0, is used as the reference case. However, it should be noted that the explanation can be given exactly in the same way by setting a reference voltage to an arbitrary voltage and by regarding the difference between this arbitrary voltage and the phase difference output voltage as the output of the phase comparator 2 even though the phase difference output voltage is the above arbitrary voltage when the phase difference is 0.

Generally, the response characteristics of a phase locked loop are calculated on the basis of a theoretical circuit having ideal constants. Further, a design of the phase locked loop is carried out on the basis of results obtained by calculations using the theoretical circuit. However, because the output voltage of the phase locked loop abruptly changes near the phase difference of 0 owing to the influence of the stray capacity Cs as described above, the constants of the theoretical circuit change, too. For this reason, the response characteristics obtained by the calculations using the theoretical circuit do not coincide with the practical response characteristics, and the phase locked loop must be designed on the basis of troublesome trial-and-error experiments.

SUMMARY OF THE INVENTION

In view of the problems described above, an object of the present invention is to provide a phase locked loop capable of reducing the non-linearity in the output voltage characteristics of a charging pump circuit portion connected to a phase comparator near the phase difference of 0 radian and allowing the charging pump circuit portion to operate stably, and a semiconductor device having a phase locked loop of this kind formed on one chip.

To solve the problems described above, a phase locked loop according to the present invention includes a charging pump circuit portion for generating a phase difference output voltage by comparing an input signal and an oscillation output signal outputted from a voltage controlled oscillator having an oscillation frequency of a signal controlled in accordance with a voltage, and constituted so as to input the phase difference output voltage from the charging pump circuit portion to the voltage controlled oscillator through a low-pass filter, and to cause the oscillation frequency of an oscillation output signal from the voltage controlled oscillator to conform to the frequency of the input signal. The phase locked loop further includes voltage source means which is connected to a phase difference output terminal of the charging pump circuit portion during each period in which the phase difference output terminal of the charging pump circuit portion is in a non-conductive state, and supplies a voltage having a potential substantially equal to the potential of the low-pass filter on the output side thereof.

Preferably, in the phase locked loop according to the present invention, a capacitor for integrating the phase difference output voltage inside the low-pass filter is connected to the voltage source means during the period in which the phase difference output terminal of the charging pump circuit portion is in a non-conductive state.

Preferably, in the phase locked loop according to the present invention, a capacitor for integrating the phase difference output voltage inside the low-pass filter is connected to the output terminal of the charging pump circuit portion during the period in which the phase difference output terminal of the charging pump circuit portion is in a non-conductive state, and the capacitor functions as the voltage source means.

Preferably, the phase locked loop according to the present invention includes a control circuit portion which has an inverter element and a logical product circuit element and to which the input signal and the oscillation output signal described above are inputted, and the inverter element and the logical product circuit element inside the control circuit portion compare the phase difference between the input signal and the oscillation output signal and so function so as to connect the output side of the charging pump circuit portion and the output side of the low-pass filter upon detecting the period in which the phase difference output terminal of the charging pump circuit portion is in a non-conductive state.

First, in the semiconductor device including the phase locked loop according to the present invention, the phase locked loop is formed on one chip, which phase locked loop includes a voltage controlled oscillator the oscillation frequency of the signal of which is controlled in accordance with a voltage; a phase comparator for comparing the phase difference between the input signal and the oscillation output signal outputted from the voltage controlled oscillator; charging pump circuit portion for generating the phase difference output voltage on the basis of the comparison result of the phase difference by the phase comparator; and a low-pass filter for smoothing the phase difference output voltage from the charging pump circuit portion; wherein the phase lock loop further has functions of inputting the output voltage smoothed by the low-pass filter to the voltage controlled oscillator and causing the oscillation frequency of the oscillation output signal from the voltage controlled oscillator to conform to the frequency of the input signal.

The phase locked loop inside the chip constituting the first semiconductor device described above includes voltage source means which is connected to the charging pump circuit portion during each period in which the phase difference output terminal of this charging pump circuit portion is in a non-conductive state, and supplies a voltage having a potential substantially equal to the potential of the low-pass filter on its output side.

Second, in the semiconductor device including the phase locked loop according to the present invention, a phase locked loop is preferably formed on one chip. The phase locked loop preferably includes a voltage controlled oscillator having an oscillation frequency of a signal controlled in accordance with a voltage; a phase comparator for comparing the phase difference between an input signal and an oscillation output signal outputted from the voltage controlled oscillator; and a charging pump circuit portion for generating a phase difference output voltage on the basis of the comparison result of the phase difference by using the voltage controlled oscillator, and preferably has a function of inputting the phase difference output voltage from the charging pump circuit portion to the voltage controlled oscillator through a low-pass filter and causing the oscillation frequency of the oscillation output signal from the voltage controlled oscillator to conform to the frequency of the input signal.

The phase locked loop inside the chip constituting the second semiconductor device described above includes voltage source means which is connected to the output terminal of the charging pump circuit portion during the period in which the phase difference output terminal of the charging pump circuit portion is in a non-conductive state and supplies a voltage having a potential substantially equal to the potential of the low-pass filter on the output side thereof, in the same way as in the first semiconductor device. In this case, the low-pass filter, which cannot be constituted relatively easily into an integration circuit, is disposed separate from the chip of the semiconductor device, and in this way, the phase locked loop can be easily assembled into one chip.

According to the phase locked loop of the present invention, the output terminal of the charging pump circuit portion and the voltage source means comprising a voltage source having a low impedance, or the like, are connected with each other near the phase difference of 0. Therefore, the influence of the stray capacity can be reduced, linearity in the phase difference output voltage of the charging pump circuit portion inside the phase locked loop can be improved, and the charging pump circuit portion can operate stably.

According to the present invention, a semiconductor device, in which the phase locked loop having the charging pump circuit portion operating stably as described above is formed on one chip and integrated into this chip, can be easily accomplished.

BRIEF DESCRIPTION OF THE DRAWINGS

The above objects and features of the present invention will be more apparent from the following description of some preferred embodiments with reference to the accompanying drawings, wherein.

DESCRIPTION OF THE PREFERRED EMBODIMENTS

Hereinafter, the description of some preferred embodiments according to the present invention will be given with reference to the accompanying drawings.

A semiconductor device according to the present invention can be easily accomplished by mounting the phase locked loop according to each preferred embodiment of the invention on one semiconductor chip.

Figure 6:
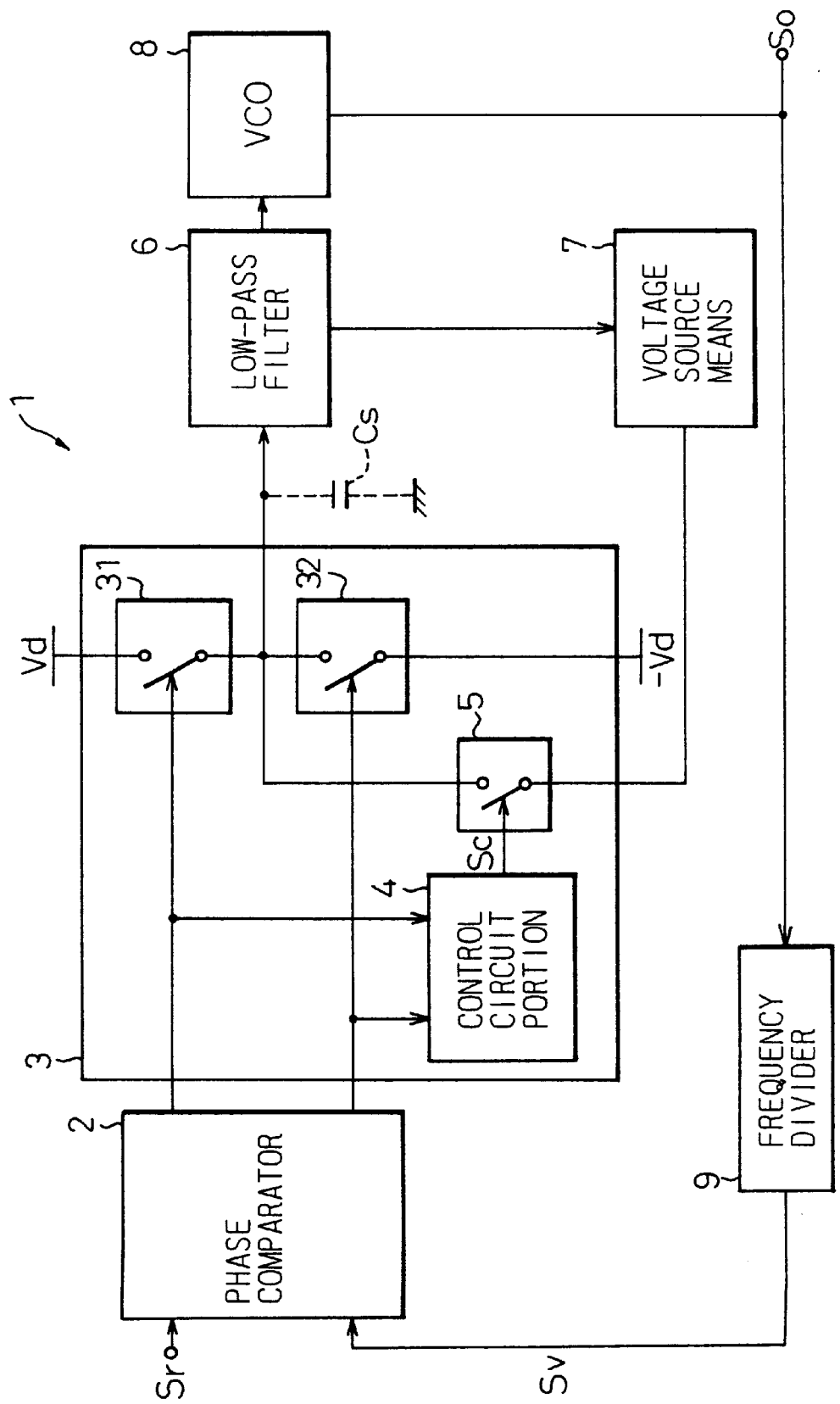
FIG. 6 is a block diagram showing an embodiment based on the basic principle of the present invention.

FIG. 6 is a block diagram showing the construction of an embodiment based on the basic principle of the present invention. In this description, like reference numerals will be used to identify like constituent elements as in FIGS. 1 to 5.

As shown in FIG. 6, the phase locked loop 1 according to the present invention includes the charging pump circuit portion 3 which generates the phase difference output voltage by comparing the phase difference between the digital input signal Sr and the oscillation output signal Sv outputted from the voltage controlled oscillator 8 in which the oscillation frequency of the signal is controlled in accordance with the voltage.

The phase difference output voltage from this charging pump circuit portion 3 is inputted to the voltage controlled oscillator 8 through the low-pass filter 6. The oscillation output signal Sv from this voltage controlled oscillator 8 is inputted either directly to the phase comparator 2, or after the oscillation frequency is suitably adjusted through the frequency divider 9. Phase locking of the phase of the phase lock signal So as the final output of the phase locked loop 1 is effected when the phase comparator 2, the charging pump circuit portion 3 and the voltage controlled oscillator 8 (including the frequency divider 9 if present) operate in such a manner as to bring the oscillation frequency of the oscillation output signal Sv into conformity with the frequency of the input signal Sr.

As shown in FIG. 6, further, the phase locked loop 1 in the basic embodiment of the present invention includes voltage source means 7 which is connected to the output terminal of the charging pump circuit portion 3 during the period in which a phase difference output terminal from the charging pump circuit portion 3 is in a non-conductive state, and supplies a voltage having a potential substantially equal to the potential of the low-pass filter 6 on the output side. This voltage source means 7 has a function of absorbing the charges accumulated in the stray capacity Cs.

Preferably, in the first place, the phase locked loop 1 shown in FIG. 6 includes the voltage controlled oscillator 8 in which the oscillation frequency of a signal is controlled in accordance with a voltage; the phase comparator 2 for comparing the phase difference between the input signal Sr and the oscillation output signal Sv outputted from the voltage controlled oscillator 8; the charging pump circuit portion 3 for generating the phase difference output voltage on the basis of the comparison result of the phase difference by using the phase comparator 2; and the low-pass filter 6 for smoothing the phase difference output voltage from the charging pump circuit portion 3; and has functions of inputting the output voltage smoothed by the low-pass filter 6 to the voltage controlled oscillator 8 and causing the oscillation frequency of the oscillation output signal Sv from the voltage controlled oscillator to conform to the frequency of the input signal Sr. In the semiconductor device in which such a phase locked loop is assembled into one chip, the phase locked loop inside this chip is constituted so as to include the voltage source means 7 which is connected to the output terminal of the charging pump circuit portion 3 and supplies a voltage having a potential substantially equal to the potential of the low-pass filter 6 on its output side, during the period in which the phase difference output terminal of the charging pump circuit portion 3 is in a non-conductive state.

Second, the phase locked loop 1 shown in FIG. 6 preferably includes the voltage controlled oscillator 8 in which the oscillation frequency of a signal is controlled in accordance with a voltage; the phase comparator 2 for comparing the phase difference between the input signal Sr and the oscillation output signal Sv outputted from the voltage controlled oscillator 8; and the charging pump circuit portion 3 for generating the phase difference output voltage on the basis of the comparison result of the phase difference by the phase comparator 2; and has functions of inputting the phase difference output voltage from this charging pump circuit portion 3 to the voltage controlled oscillator 8 through the low-pass filter 6 and causing the oscillation frequency of the oscillation output signal Sv from the voltage controlled oscillator 8 to conform to the frequency of the input signal Sr. In the semiconductor device formed by assembling such a phase locked loop into one chip, the phase locked loop inside the chip is constituted so as to include the voltage source means 7 which is connected to the output terminal of the charging pump circuit portion 3 and supplies a voltage having a potential substantially equal to the potential of the low-pass filter 6 on its output side during the period in which the phase difference output terminal of from the charging pump circuit portion 3 is in a non-conductive state. In other words, the low-pass filter 6, which cannot be easily integrated into one chip and constituted as an integrated circuit, is disposed separate from the chip of the semiconductor device in this case so that the phase locked loop can be easily formed on one chip.

The explanation will be given in further detail. The charging pump circuit portion 3 of the phase locked loop 1 according to the present invention shown in FIG. 6 includes the first switch element 31 and a second switch element 32. These first and second switch elements 31 and 32 are connected to a positive power source having a power source voltage Vd and to a negative power source having a power source voltage -Vd in the same way as in the case of the phase locked loop shown in FIG. 1. When the phase difference is in a state of leading phase, the first switch element 31 is turned OFF while the second switch element 32 is turned ON, and the phase difference output voltage having the negative polarity is outputted from the charging pump circuit portion 3. On the other hand, when the phase difference is in a state of the lagging phase, the first switch element 31 is turned ON while the second switch element 32 is turned OFF, and the phase difference output voltage having the positive polarity is outputted from the charging pump circuit portion 3.

Further, both of the first and second switch elements 31 and 32 are turned OFF near the phase difference of 0 radian, and a phase difference output terminal of the charging pump circuit portion 3 becomes non-conductive. Typically, the level of the phase difference output voltage outputted from the charging pump circuit portion 3 becomes 0.

Further, the charging pump circuit portion 3 shown in FIG. 6 includes a control circuit portion 4 disposed on the output side of the phase comparator and a switch circuit portion 5 connected between the voltage source means 7 and the output terminal of the charging pump circuit portion 3. The control circuit portion 4 controls ON/OFF operations of the switch circuit portion 5 in accordance with the phase difference.

In the phase locked loop 1 according to the present invention, the first and second switch elements 31 and 32 constituting the charging pump circuit portion 3 supply the phase difference output voltage corresponding to the phase difference output signal from the phase comparator 2 to the low-pass filter 6. The switch circuit portion 5 comprising an analog switch, or the like, is turned ON when both of the first and second switch elements 31 and 32 are turned OFF, that is, when the phase difference output terminal of the charging pump circuit portion 3 is in a non-conductive state, and connects the voltage source means 7 to the output terminal of the charging pump circuit portion 3. In this instance, the charges accumulated in the stray capacity Cs existing at the circuit portions disposed at the back of the output terminal of the charging pump circuit portion 3 flow into the voltage source of the voltage source means 7.

Assuming that the switch circuit portion 5 is turned OFF even near the phase difference of 0 radian, the relationship between the phase difference of the charging pump circuit portion 3 and the output voltage smoothed by the low-pass filter 6 becomes a linear relation containing the offset corresponding to the difference between the voltage supplied from the voltage source means 7 and the output voltage at the time of the phase lock.

Near the phase difference of 0 radian in this case, however, the switch circuit portion 5 is turned ON by the control input signal Sc of the control circuit portion 4. Therefore, the offset due to the difference between the voltage supplied from the voltage source means 7 and the output voltage at the time of phase lock is cancelled by feeding back the output voltage of the low-pass filter or the voltage of the capacitor used for the low-pass filter and using it as the voltage source.

As described above, in the basic embodiment of the present invention, the output terminal of the charging pump circuit portion and the voltage source means comprising the low impedance voltage source etc., are connected with each other near the phase difference of 0 radian, so that the influence of the stray capacity Cs can be reduced, linearity in the phase difference output voltage of the charging pump circuit portion in the phase locked loop can be improved, and the charging pump circuit portion can operate stably.

Furthermore, according to the basic embodiment of the present invention, a semiconductor device in which the charging pump circuit portion that stably operates as described above is formed on one chip, can be easily accomplished.

Figure 7:
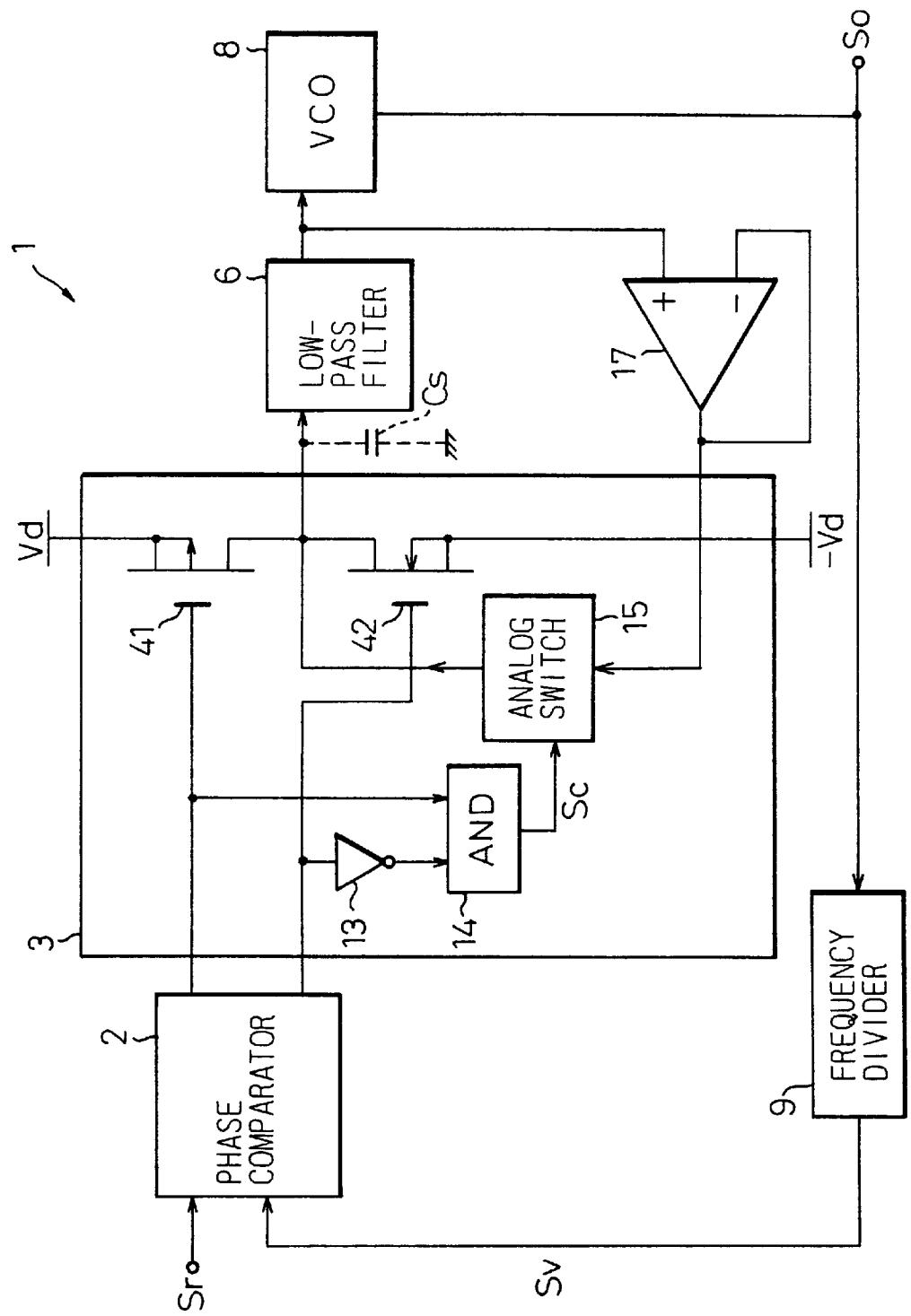
FIG. 7 is a block circuit diagram showing the construction of the first preferred embodiment of the present invention.

FIG. 7 is a block circuit diagram showing the construction of the first preferred embodiment of the present invention (hereinafter referred to as the "first embodiment"). However, the construction of the phase lock loop is shown simplified in the same way as in FIG. 1, and like reference numerals will be used hereinafter to identify like constituent elements.

As shown in FIG. 7, the phase locked loop 1 includes the phase comparator 2, the charging pump circuit portion 3, the low-pass filter 6, the voltage controlled oscillator (VCO) 8 and the frequency divider 9, and these constituent elements together constitute a loop system control circuit.

Figure 1:
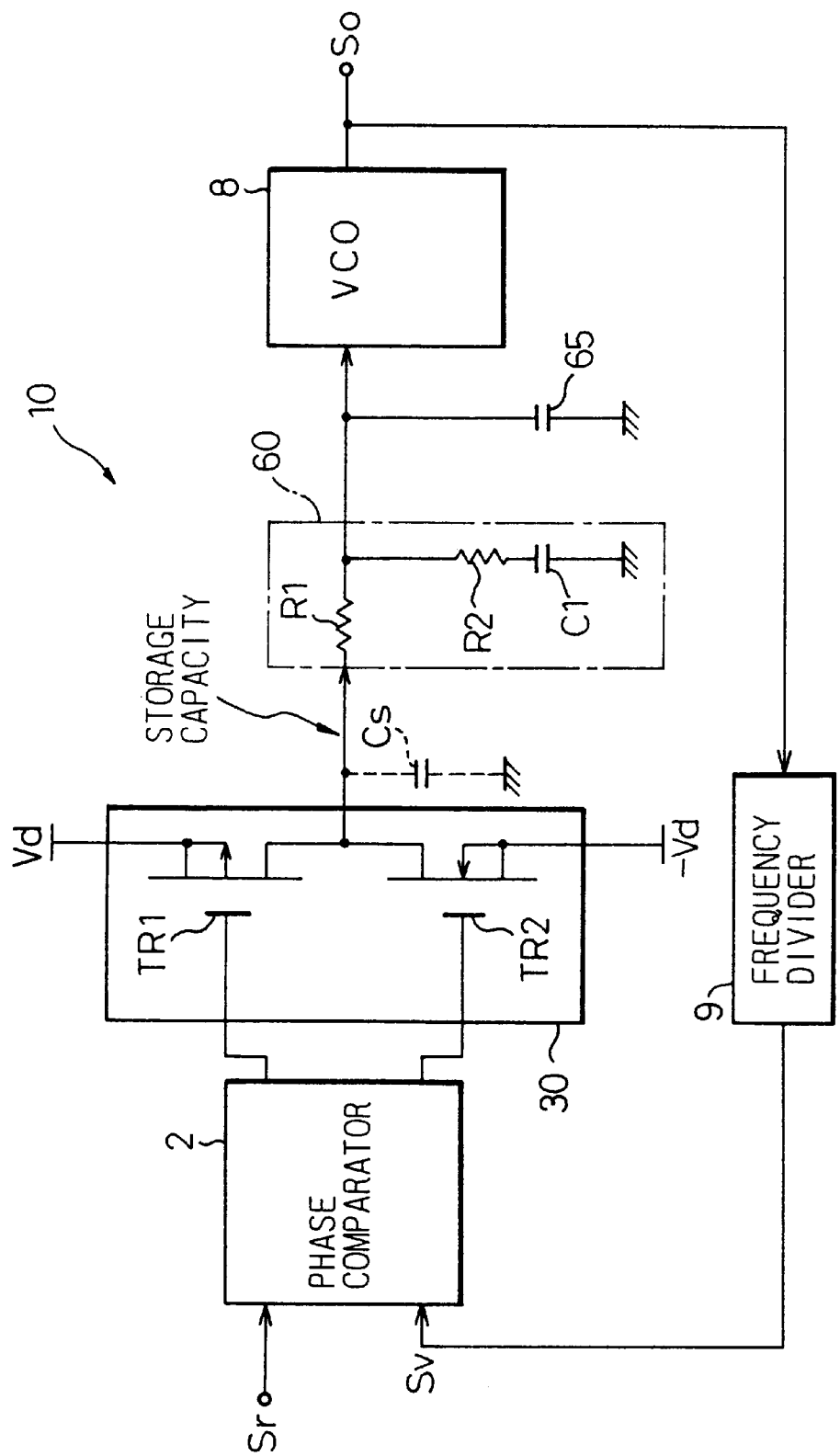
FIG. 1 is a block circuit diagram showing the construction of a phase locked loop according to the prior art.
Figure 2:
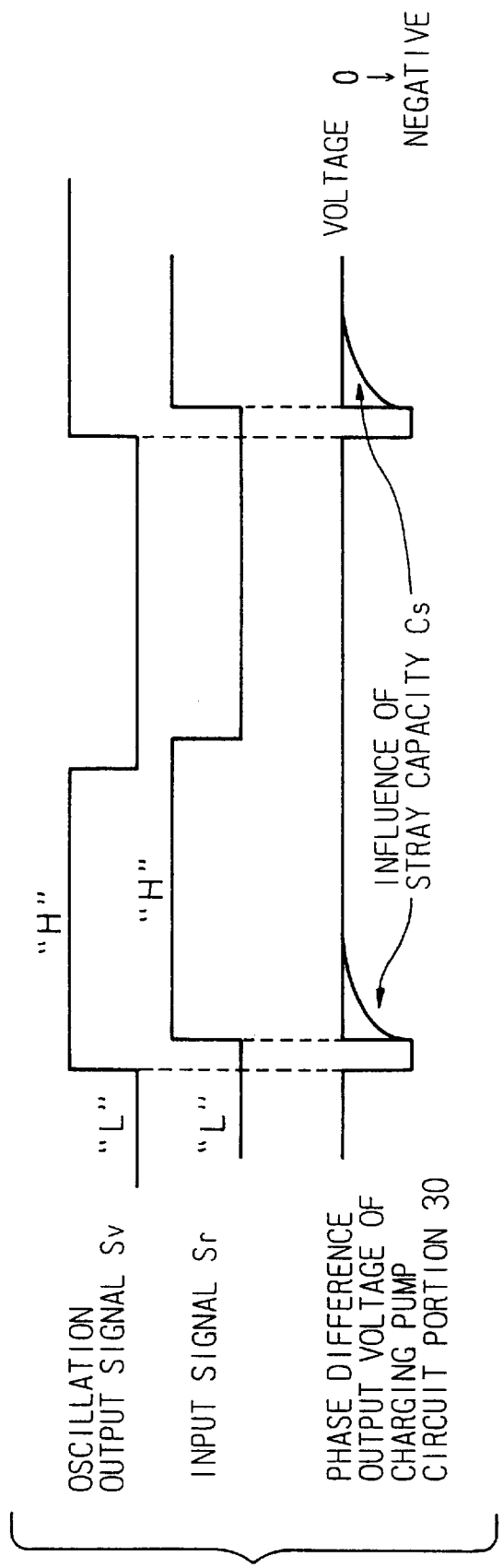
FIG. 2 is a timing chart for explaining an operation of a conventional charging pump circuit portion when a phase difference is in the proximity of 0 radian and a phase is a leading phase.
Figure 3:
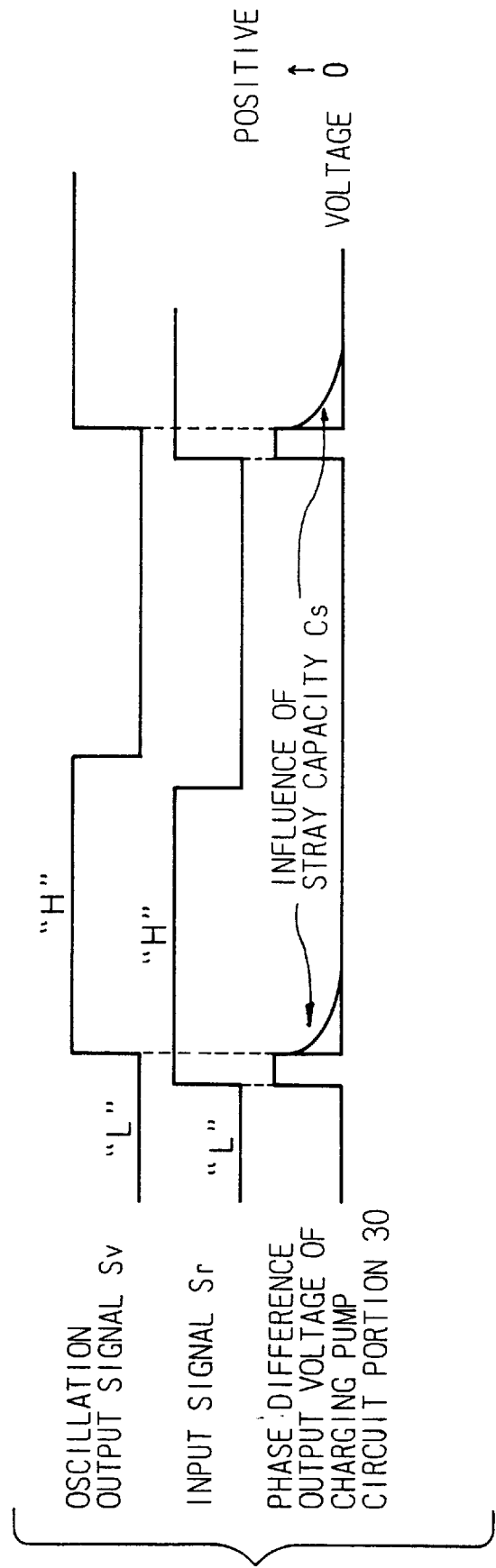
FIG. 3 is a timing chart for explaining an operation of a conventional charging pump circuit portion when the phase difference is in the proximity of 0 radian and the phase is a lagging phase.
Figure 4:
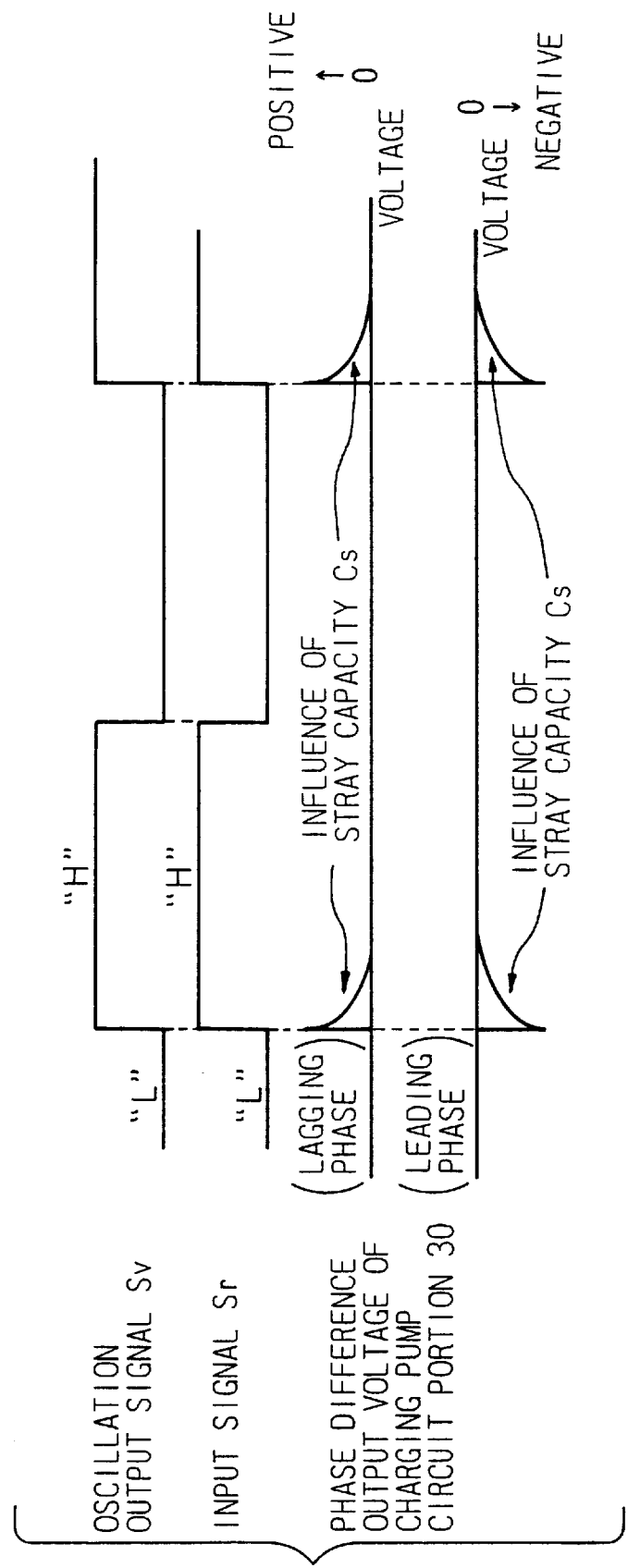
FIG. 4 is a timing chart for explaining an operation of a conventional charging pump circuit portion when the phase difference is very close to 0 radian.
Figure 5:
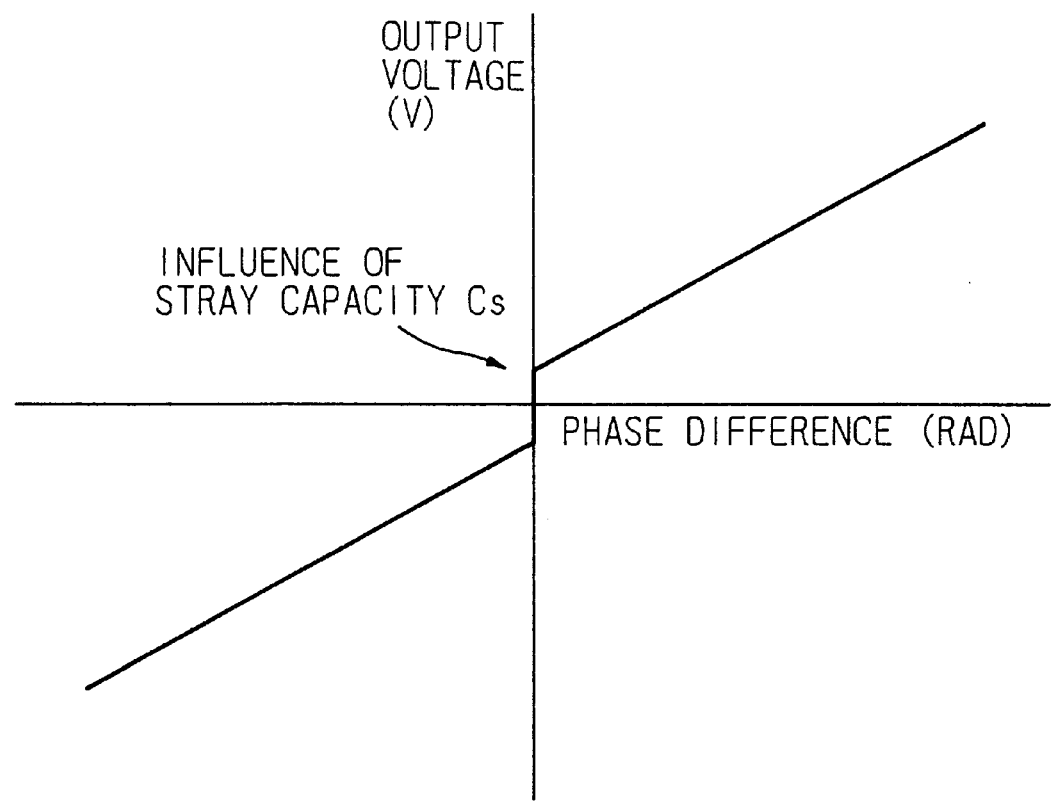
FIG. 5 is a graph showing the relationship between the phase difference and an output voltage in the phase locked loop according to the prior art.

In FIG. 7, the phase comparator 2 aligns the phases of the input signal Sr and the oscillation output signal Sv with the phase of the reference signal in order to compare the phase difference between the digital input signal Sr and the oscillation output signal Sv of the voltage controlled oscillator 8 (or the frequency divider 9), for example, in the same way as in the case of FIG. 1.

After phase alignment is effected in this way, two kinds of phase difference comparison signals outputted from the phase comparator 2 are inputted to the charging pump circuit portion 3. This charging pump circuit portion 3 includes the first transistor 41, comprising a P-channel field effect transistor (usually abbreviated to "FET"), and the second transistor 42, comprising an N-channel field effect transistor, that are connected with each other in a push-pull form between a positive power source having a power source voltage Vd and a negative power source having power source voltage —Vd. The two kinds of phase difference comparison signals are inputted to gate terminals of the first and second transistors 41 and 42, respectively, and are outputted as the phase difference output voltages from the junctions of drain terminals of these first and second transistors 41 and 42.

Further, the phase difference output voltage from the charging pump circuit portion 3 is inputted to the low-pass filter 6. This low-pass filter 6 constitutes an integration circuit including two resistors and one capacitor in the same way as the low-pass filter 60 shown in FIG. 1, and has a function of smoothing the phase difference output voltage from the charging pump circuit portion 3.

The output voltage smoothed by the low-pass filter 6 has a voltage value corresponding to the phase difference. Therefore, when the smoothed output voltage is inputted to the voltage controlled oscillator 8, the oscillation output signal Sv having an oscillation frequency corresponding to the phase difference is outputted from the voltage controlled oscillator 8. This oscillation output signal Sv is inputted to the phase comparator 2 either directly, or after the oscillation frequency is suitably adjusted through the frequency divider 9. The phase comparator 2, the charge pump circuit portion 3 and the voltage controlled oscillator 8 (or inclusive of the frequency divider 9) operate so that the oscillation frequency of the oscillation output signal Sv coincides with the frequency of the input signal Sr in accordance with the phase difference, and lock of the phase of the phase lock signal So, as the final output of the phase locked loop 1, is effected.

Further, the phase locked loop 1 in the first embodiment shown in FIG. 7 includes an operational amplifier 17 functioning as a low impedance voltage source as the voltage source means 7 (see FIG. 6). One of the input terminals (non-inverted input terminal (+)) of this operational amplifier 17 is connected to the output side of the low-pass filter 6 and the other input terminal (inverted input terminal (−)) is directly connected to the output terminal of the operational amplifier 17. This operational amplifier 17 corresponds to the voltage source for supplying a predetermined voltage when both of the first and second transistors 41 and 42 are turned OFF. Here, the output voltage of the low-pass filter 6 is as such amplified with an amplification factor of one (1) so as to absorb the charges accumulated in the stray capacity Cs.

The control circuit portion 4 (see FIG. 6) in the charging pump circuit portion 3 in FIG. 7 comprises an inverter element (NOT element) 13 and a logical product circuit element (AND element) 14. An analog switch 15 is disposed as the switch circuit portion 5 (see FIG. 6) inside the charging pump circuit portion 3.

Figure 8:
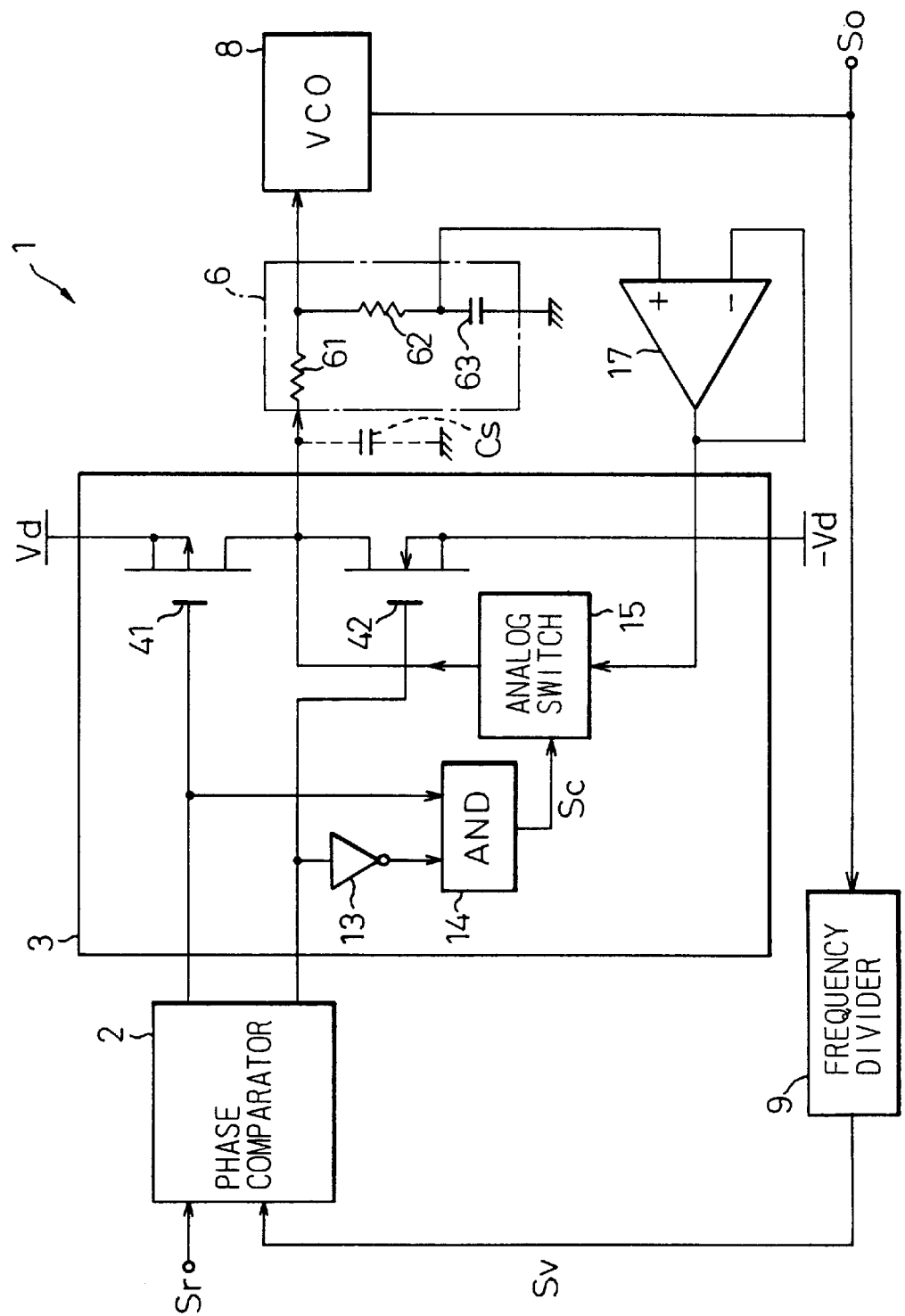
FIG. 8 is a block circuit diagram showing the construction of the second preferred embodiment of the present invention.

When the phase difference of the input signal Sr and the oscillation output signal Sv is substantially 0, the "H" level first phase difference comparison signal is inputted to the gate terminal of the first transistor 41 while the "L" level second phase difference comparison signal is inputted to the gate terminal of the second transistor 42. At this time, both of the first and second transistors 41 and 42 are turned OFF. Further, the logical product circuit element 14 inside the control circuit portion 4 receives the first phase difference comparison signal and the second phase difference comparison signal, after passing through the inverter element 13, as the input signals. Therefore, the level of the output of the logical product circuit portion 14 becomes the "H" level. This "H" level control input signal Sc from the logical product circuit element 14 turns ON the analog switch 15 and the output terminal of the charging pump circuit portion 3 and the operational amplifier 17 are connected with each other. In consequence, the charges accumulated in the stray capacity Cs are absorbed in the operational amplifier 17, and non-linearity in the phase difference output voltage of the charging pump circuit portion 3 is reduced. FIG. 8 is a block circuit diagram showing the construction of the second preferred embodiment of the present invention (hereinafter referred to as the "second embodiment"). In FIG. 8, the low-pass filter 6 constitutes an integration circuit including two resistors 61 and 62 and one capacitor 63 for integrating the phase difference output voltage, in the same way as in the case of FIG. 1. The filter having such a circuit construction is also referred to as a "lag-lead filter".

The construction of the second embodiment shown in FIG. 8 is substantially the same as that of the first embodiment, but the connection relation between the low-pass filter 6 and the operational amplifier 17 is different from the first embodiment.

In the operational amplifier 17 shown in FIG. 8, one of the input terminals is connected to the junction between the resistor 62 and the capacitor 63, while the other input terminal is directly connected to the output terminal of the operational amplifier 17. According to the construction of the operational amplifier 17, the voltage at one of the terminals of the capacitor 63 constituting the low-pass filter 6 (the voltage at the junction between the resistor 62 and the capacitor 63) is as such amplified with an amplification factor of 1 so as to absorb the charges accumulated in the stray capacity Cs. Here, the voltage at one of the terminals of the capacitor 63 has a potential substantially equal to the potential of the low-pass filter 6 on the output side thereof.

Figure 9:
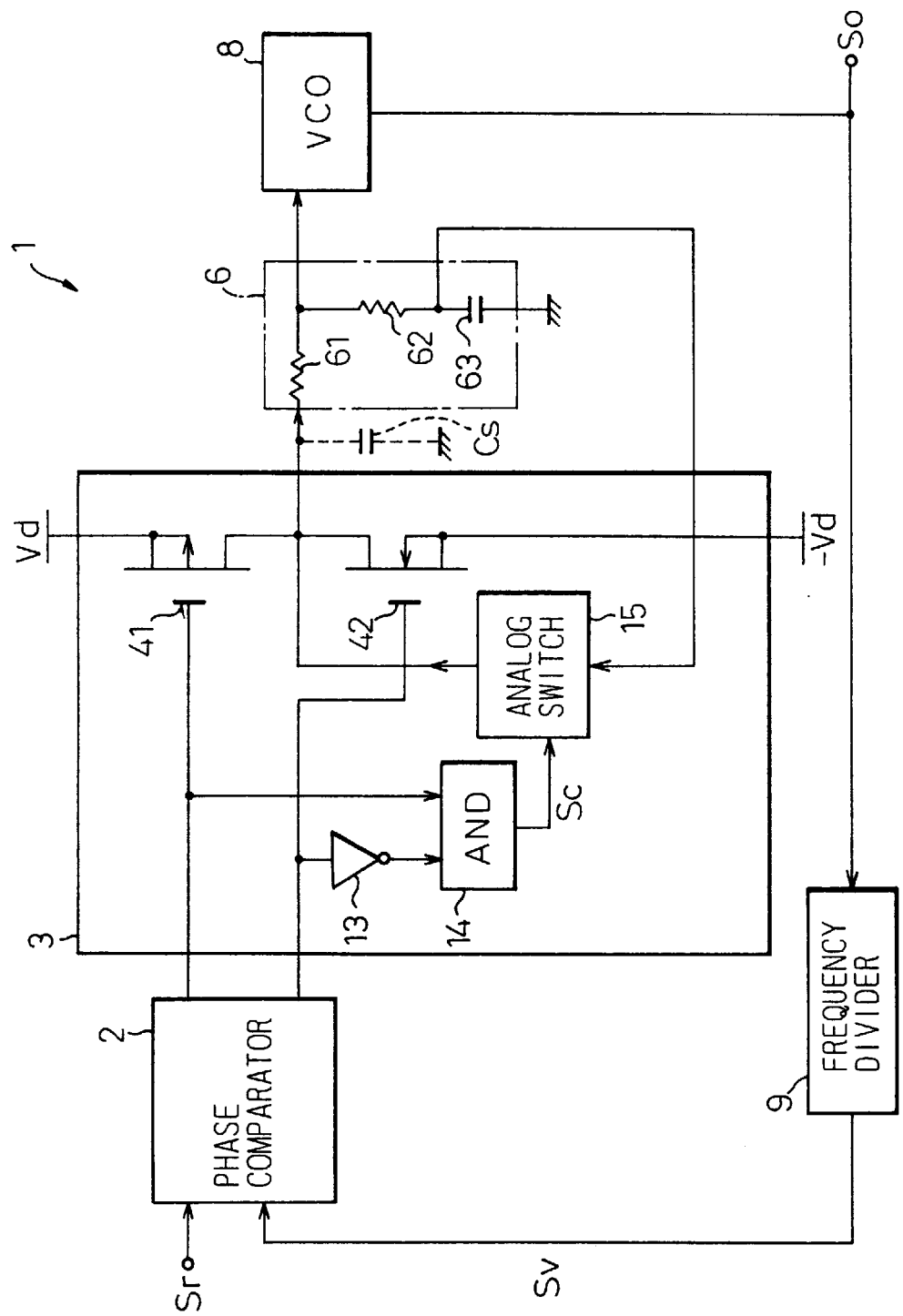
FIG. 9 is a block circuit diagram showing the construction of the third preferred embodiment of the present invention.

FIG. 9 is a block circuit diagram showing the construction of the third preferred embodiment of the present invention (hereinafter referred to as the "third embodiment"). The construction of the third embodiment shown in FIG. 9 is substantially the same as that of the second embodiment described above, but is different from the second embodiment in that the operational amplifier 17 (see FIG. 8) is not disposed. More concretely, in the third embodiment shown in FIG. 9, the junction between the resistor 62 and the capacitor 63 constituting the low-pass filter 6 is directly connected to the input side of the analog switch 15 without passing through the operational amplifier 17. This embodiment uses the capacitor 63 as a low impedance voltage source, by paying special attention to the point that the capacitance of the capacitor 63 used for the low-pass filter 6 is generally much greater (in the order of approximately 1,000 times) than that of the stray capacity Cs. In other words, one of the terminals of the capacitor 63 constituting the low-pass filter 6 is as such connected to the output terminal of the charging pump circuit portion in order to absorb the charges accumulated in the stray capacity Cs.

According to the construction of the third embodiment described above, the capacitor 63 inside the low-pass filter 6, functioning as an integration circuit, can be used also as the voltage source for absorbing the charges in the stray capacity Cs. Therefore, some circuit components such as the operational amplifier can be omitted.

Figure 10:
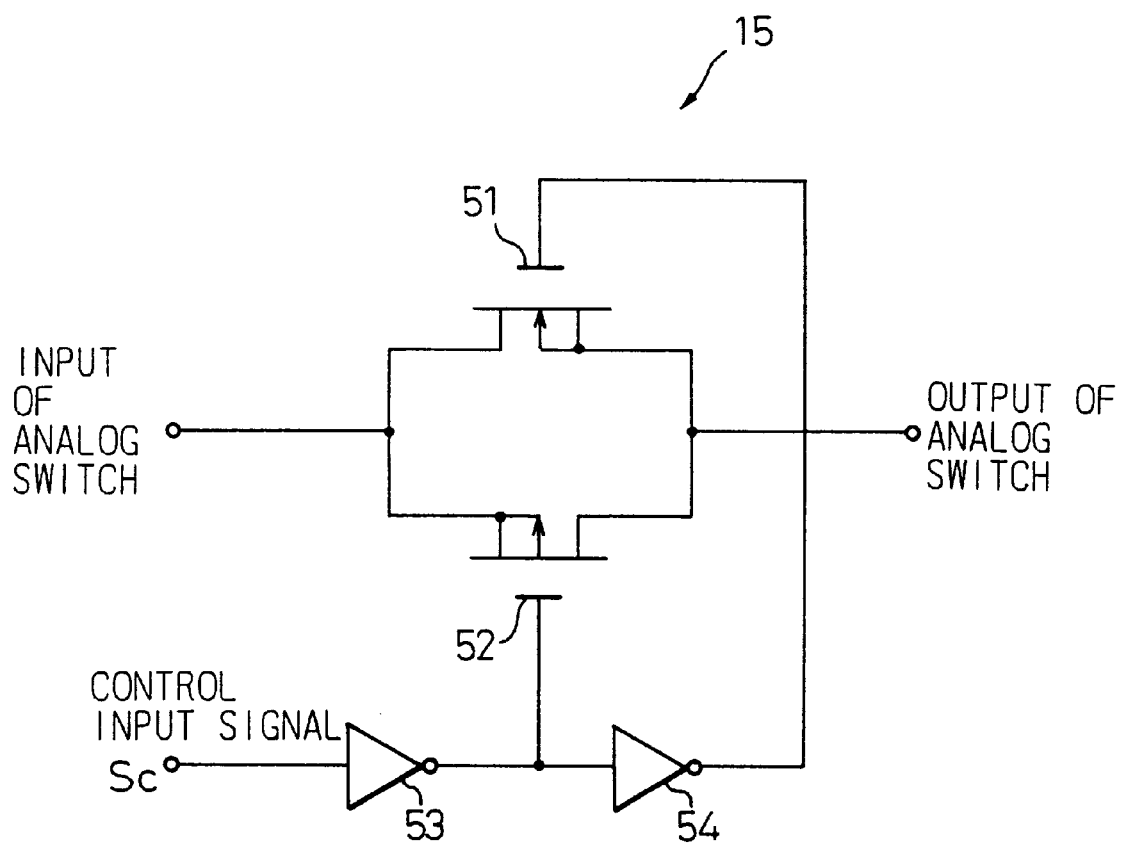
FIG. 10 is a circuit diagram showing an example of the circuit construction of an analog switch in each of the preferred embodiments of the present invention.

FIG. 10 is a circuit diagram showing an example of the circuit construction of the analog switch in the embodiment described above. Here, the circuit construction of the analog switch 15 used in each of the first to third embodiments will be illustrated in detail.

As shown in FIG. 10, the analog switch 15 includes first and second field effect transistors (FETs) 51 and 52 that have opposite polarities to each other and are connected in parallel with each other, and two inverter elements 53 and 54. The input side of the analog switch 15 is connected to the operational amplifier 17, or to the capacitor 63, and its output side is connected to the output terminal of the charging pump circuit portion 3.

The control input signal Sc from the afore-mentioned logical product circuit element 14 is transferred to the gate terminal of the second P-channel field effect transistor 52, through one of the inverter elements 53. On the other hand, the control input signal Sc from the logical product circuit element 14 is transferred to the gate terminal of the N-channel first field effect transistor 51, through two inverter elements 53 and 54.

Next, an operation of the analog switch 15 shown in FIG. 10 will be explained, In FIG. 10, when the "H" level control input signal Sc is inputted to the control input terminal of the inverter element 53, the potential of the gate terminal of the first field effect transistor 51 becomes higher than the potential of the source terminal, and the potential of the gate terminal of the second field effect transistor 52 becomes lower than the potential of the source terminal. Therefore, even when the phase difference output voltage from the charging pump circuit portion may be a positive or negative voltage (the voltage value of the smoothed voltage is close to 0), either one of the first and second field effect transistors 51 and 52 becomes conductive, and the analog switch 15 is turned ON.

On the other hand, when the "L" level control input signal Sc is inputted to the control input terminal of the inverter element 53, the potential of the gate terminal of the first field effect transistor 51 becomes lower than the potential of the source terminal, and the potential of the gate terminal of the second field effect transistor 52 becomes higher than the potential of the source terminal. In this case, therefore, both of the first and second field effect transistors 51 and 52 become non-conductive, and the analog switch 15 is turned OFF.

Figure 11:
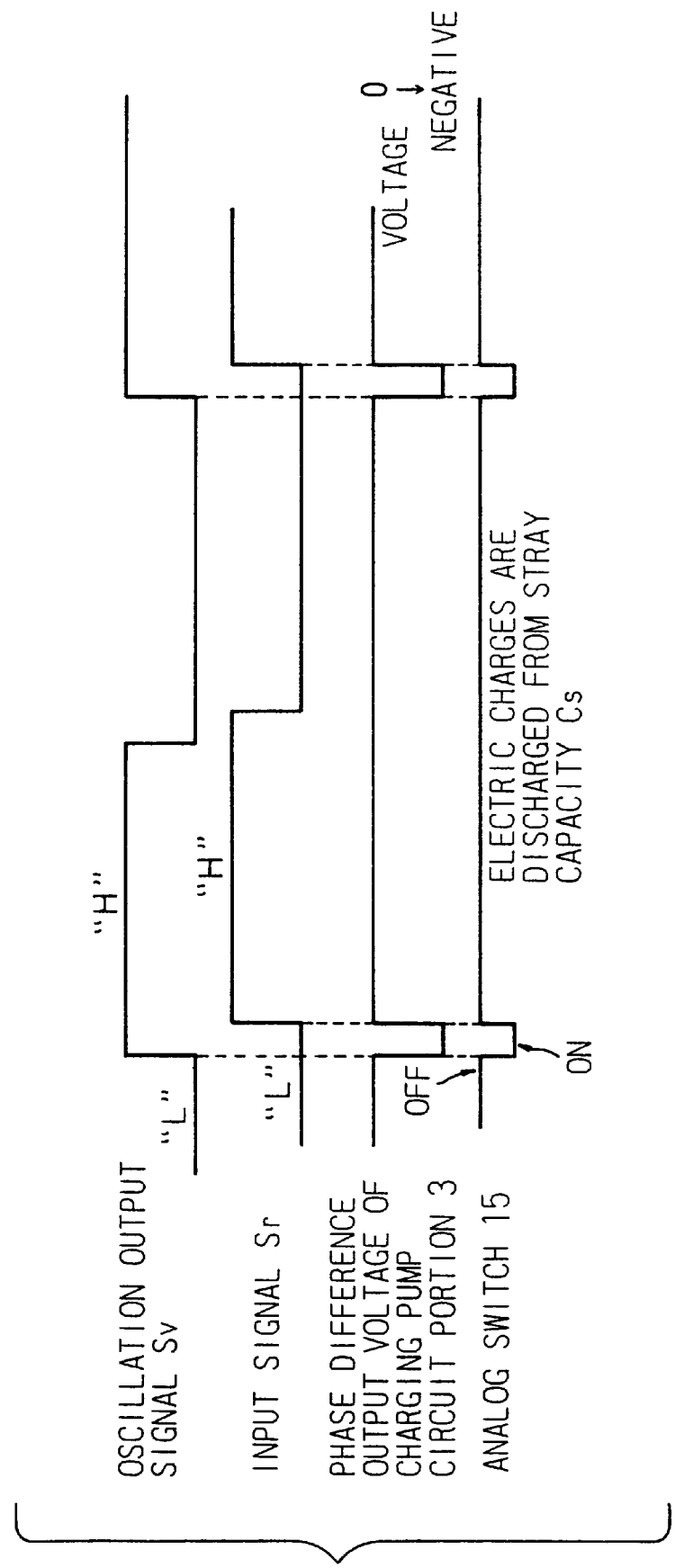
FIG. 11 is a timing chart for explaining an operation of a charging pump circuit portion according to the present invention when the phase difference is in the proximity of 0 radian and the phase is the leading phase.
Figure 12:
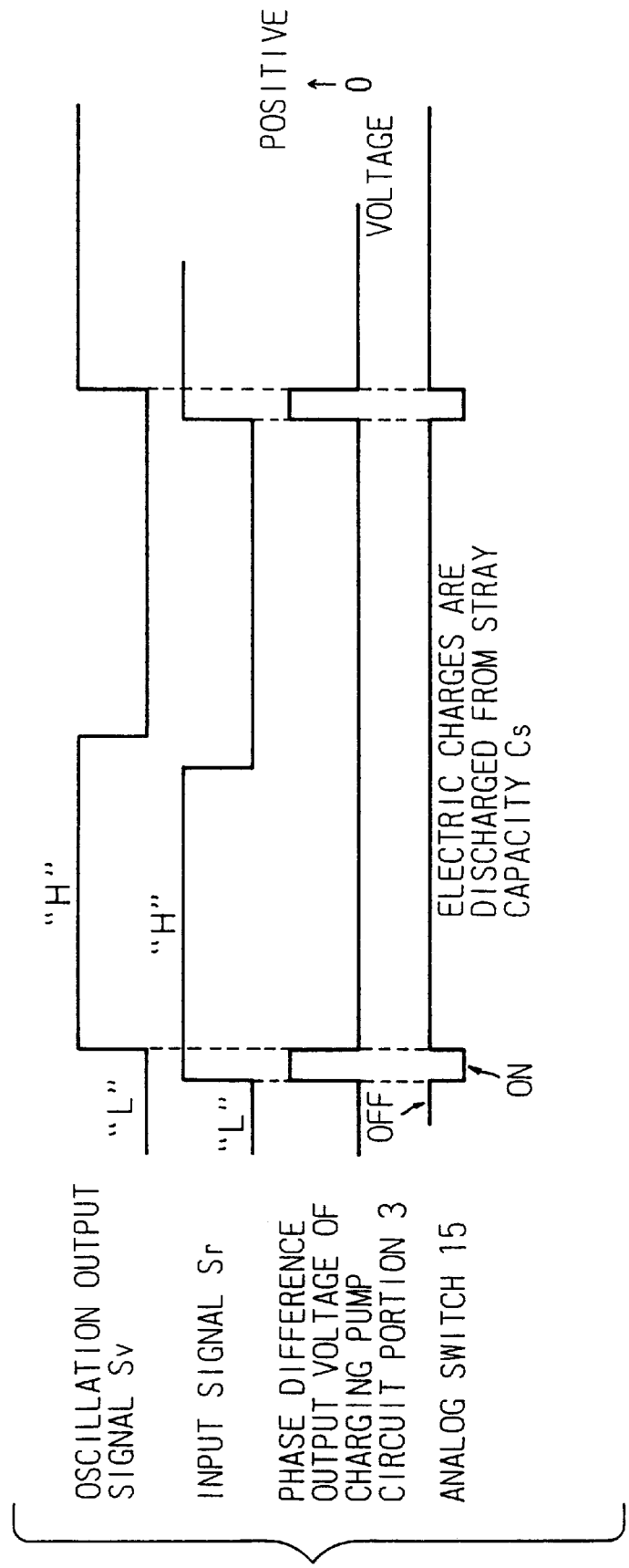
FIG. 12 is a timing chart for explaining an operation of the charging pump circuit portion according to the present invention when the phase difference is in the proximity of 0 radian and the phase is the lagging phase.
Figure 13:
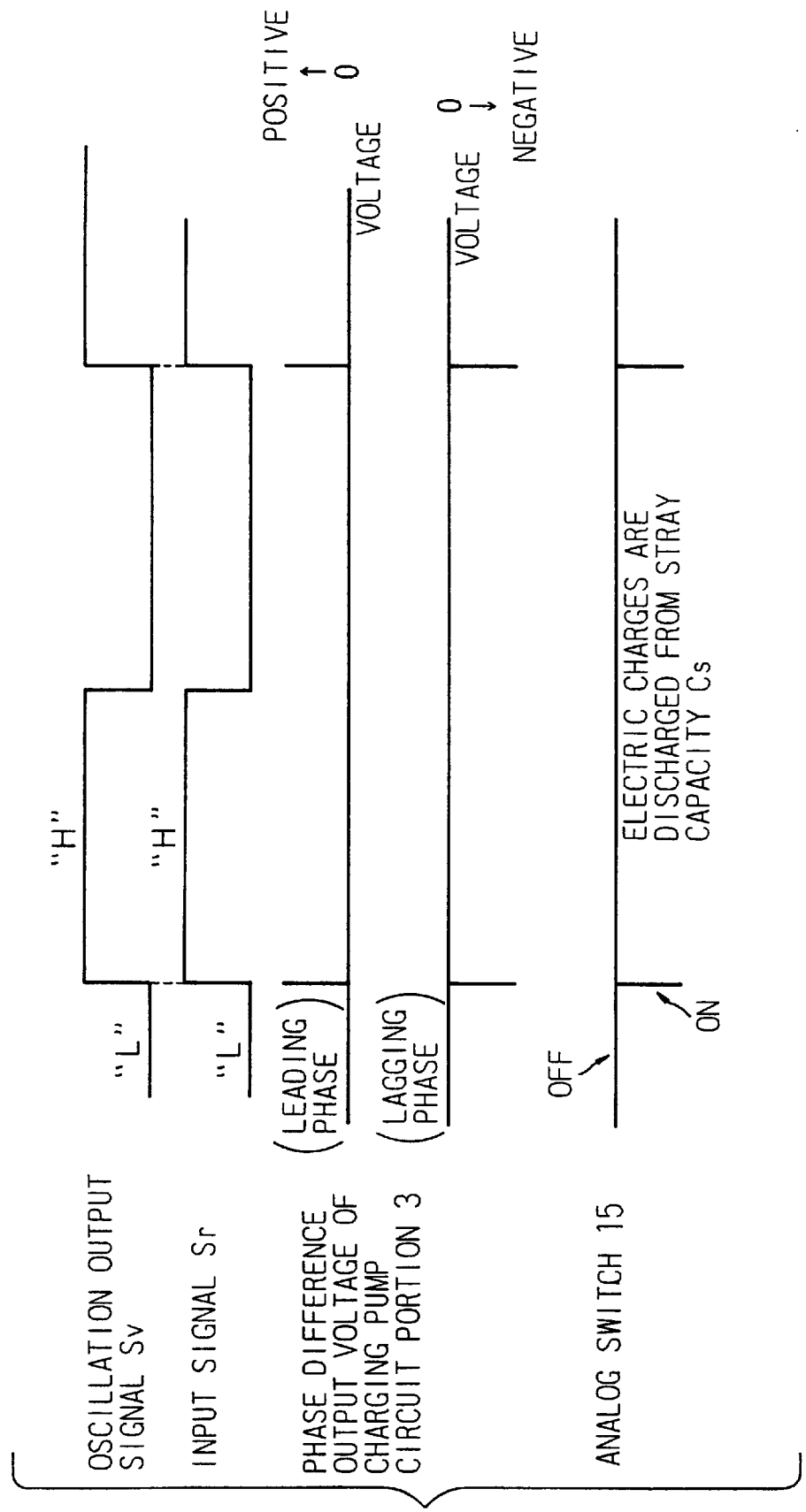
FIG. 13 is a timing chart for explaining the operation of the charging pump circuit portion according to the present invention when the phase difference is very close to 0 radian.

FIG. 11 is a timing chart for explaining an operation of the charging pump circuit portion according to the present invention when the phase difference is near 0 radian and the phase is the leading phase; FIG. 12 is a timing chart for explaining an operation of the charging pump circuit portion according to the present invention when the phase difference is near 0 radian and the phase is the lagging phase; and FIG. 13 is a timing chart for explaining an operation of the charging pump circuit portion according to the present invention when the phase difference is very close to 0 radian.

FIG. 11 shows the state in which the phase difference between the digital input signal Sr and the oscillation output signal Sv is near 0 radian and the phase of the oscillation output signal Sv is slightly ahead of the phase of the input signal Sr, that is, the leading phase.

As shown in FIG. 11, the second transistor 42 (see, for example, FIG. 7) becomes conductive for the period corresponding to the phase difference generated due to the difference between times of leading edges from the "L" level to the "H" level of the input signal Sr and the oscillation output signal Sv, and the negative phase difference output voltage is outputted from the charging pump circuit portion 3 (see, for example, FIG. 7). Further, unlike the prior art already described (see FIG. 2), the output terminal of the charging pump circuit portion 3 is connected to the low impedance voltage source in FIG. 11 when the phase difference output terminal of the charging pump circuit portion 3 becomes non-conductive, e.g., when the phase difference output voltage changes to 0 and consequently, when both of the first and second transistors 41 and 42 (see, for example, FIG. 7) become non-conductive. Accordingly, the charges accumulated in the stray capacity Cs are instantaneously discharged from the low impedance voltage source, and the negative phase difference output voltage from the charging pump circuit potion 3 rapidly returns to 0. In other words, the phase difference output terminal of the charging pump circuit portion 3 becomes non-conductive. FIG. 12 shows the state in which the phase difference between the digital input signal Sr and the oscillation output signal Sv is near 0 radian and the phase of the oscillation output signal Sv is slightly behind the phase of the input signal Sr, that is, the lagging phase.

As shown in FIG. 12, the first transistor 41 becomes conductive for only the period corresponding to the phase difference generated due to the difference between times of leading edges from the "L" level to the "H" level of the input signal Sr and the oscillation output signal Sv, and the positive phase difference output voltage is outputted from the charging pump circuit portion 3. In FIG. 12, further, unlike the prior art already described (see FIG. 3), the output terminal of the charging pump circuit portion 3 is connected to the low impedance voltage source when the phase difference output terminal of the charging pump circuit portion 3 becomes non-conductive, e.g., when the phase difference output voltage changes to 0 and consequently, when both of the first and second transistors 41 and 42 become non-conductive. Accordingly, the charges accumulated in the stray capacity Cs are instantaneously discharged from the low impedance voltage source, and the positive phase difference output voltage from the charging pump circuit portion 3 rapidly returns to 0. In other words, the phase difference output terminal of the charging pump circuit portion 3 becomes non-conductive.

FIG. 13 shows the state in which the phase difference between the digital input signal Sr and the oscillation output signal Sv is very close to 0 radian and the phase is a slight lagging phase or a slight leading phase.

Since the phase difference generated due to the difference between times of leading edges from the "L", level to the "H" level of the input signal Sr and the oscillation output signal Sv is substantially 0 as shown in FIG. 13, both of the first and second transistors TR1 and TR2 are in a non-conductive state for all the periods, and the phase difference output terminal of the charging pump circuit portion 30 becomes non-conductive. Most typically, the phase difference output voltage from the charging pump circuit portion 3 remains at 0. Further, in FIG. 13, the output terminal of the charging pump circuit portion 3 is connected to the low impedance voltage source even when the phase changes from the slight lagging phase or the slight leading phase to 0 radian and consequently, when both of the first and second transistors 41 and 42 are in a non-conductive state, unlike the prior art already described (see FIG. 4). Accordingly, the charges in the stray capacity Cs are instantaneously discharged from the low impedance voltage source, and the positive pulse-like voltage and the negative pulse-like voltage do not substantially occur in the charging pump circuit portion 3.

Figure 14:
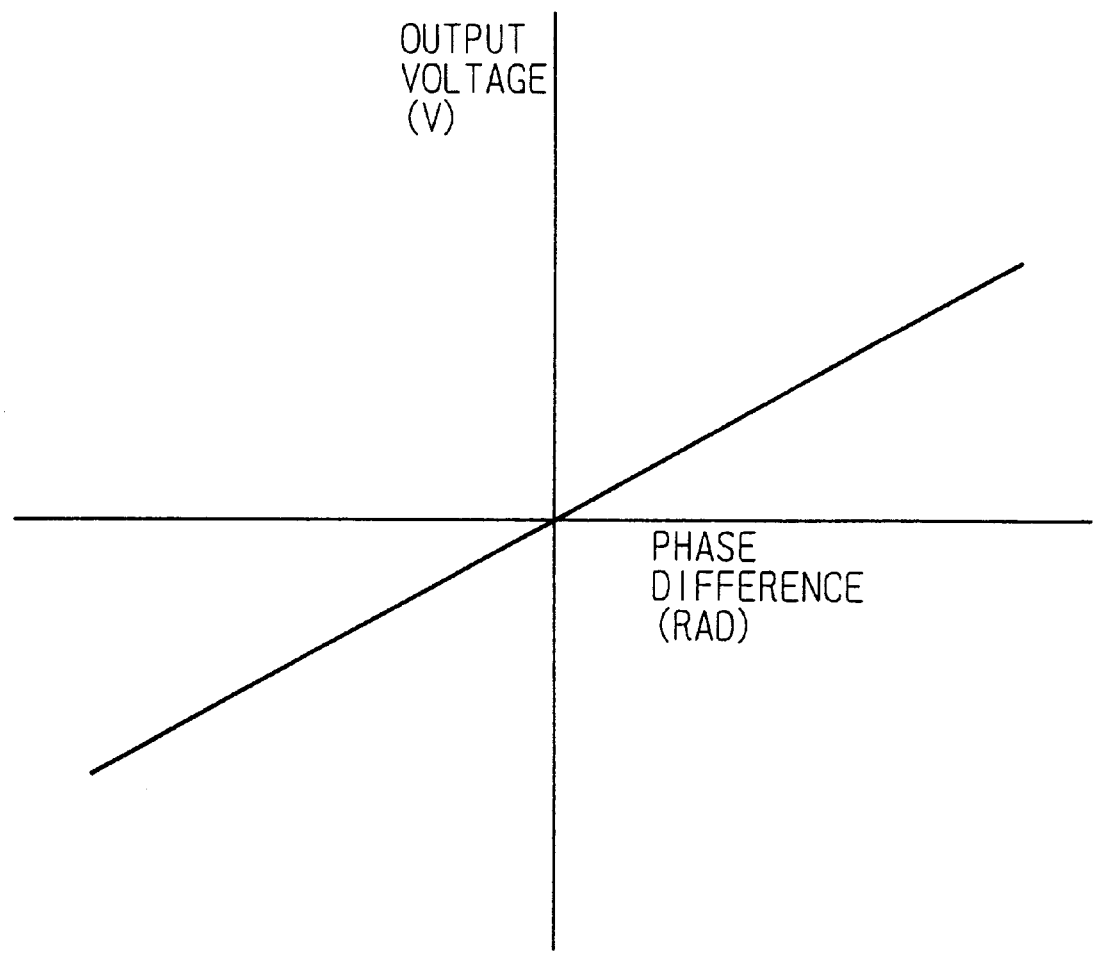
FIG. 14 is a graph showing the relationship between the phase difference and the output voltage in the phase locked loop according to the present invention.

In each of the foregoing embodiments, the phase locked loop operates in such a manner that when the phase change occurs from the lagging phase or the leading phase to 0 radian, the output terminal of the charging pump circuit portion 3 is connected to the low impedance voltage source even though both of the first and second transistors 41 and 42 become non-conductive. Therefore, the change of the output level on the output side of the charging pump circuit portion 3 does not occur near the phase difference of 0 radian. As a result, as represented by the graph of FIG. 14, the output voltage smoothed by the low-pass filter 6 has a substantially ideal linearity with respect to the phase difference.

First, according to the preferred embodiments of the phase locked loop of the present invention, the output side of the low-pass filter and the output terminal of the charging pump circuit portion are connected with each other, during the period in which the phase difference output terminal of the charging pump circuit portion is in a non-conductive state. Therefore, the influence of the stray capacity can be reduced, linearity in the phase difference output voltage of the charging pump circuit portion can be improved, and the charging pump circuit portion can operate stably.

Second, according to the preferred embodiments of the phase locked loop of the present invention, one of the ends of the capacitor having a relatively small temperature change inside the low-pass filter and the output terminal of the charging pump circuit portion are connected with each other by the low impedance voltage source means. Therefore, the influence of the stray capacity can be reduced, linearity in the phase difference output voltage of the charging pump circuit portion can be improved, and the temperature characteristics of the phase difference output voltage can be improved, too.

Third, according to the preferred embodiments of the phase locked loop of the present invention, the capacitor inside the low-pass filter is used as the low impedance voltage source during the period in which the phase difference output terminal of the charging pump circuit portion is in a non-conductive state, and one of the end portions of this capacitor and the output terminal of the charge pump circuit portion are connected with each other. Therefore, the influence of the stray capacity can be reduced, linearity in the phase difference output voltage of the charging pump circuit portion can be improved, and some constituent components, such as the operational amplifier, can be omitted.

Fourth, according to the phase locked loop of the present invention, the output side of the charging pump circuit portion and the output side of the low-pass filter are connected with each other when the inverter element and the logical product circuit element inside the charging pump circuit portion detect the period in which the phase difference output terminal of the charging pump circuit portion is in a non-conductive state. Therefore, linearity in the phase difference output voltage of the charging pump circuit portion can be improved by a simple circuit construction, and the charging pump circuit portion can operate stably.

According to the semiconductor device including the phase locked loop according to the preferred embodiments of the present invention, a semiconductor device having the phase locked loop including the charging pump circuit portion, which can improve linearity in the phase difference output voltage that operates stably, and which is formed on one chip, can be accomplished by integrating the voltage controlled oscillator, the phase comparator, the charging pump circuit portion and the low-pass filter as an integrated circuit.

Further, according to the semiconductor device including the phase locked loop of the preferred embodiments of the present invention, an integration of the phase locked loop including the charging pump circuit portion, which can improve linearity in the phase difference output voltage and which can operate stably, can be accomplished relatively easily by forming the voltage controlled oscillator, the phase comparator and the charging pump circuit portion on one chip, and forming the low-pass filter including the capacitor and the resistors separate from the chip.

I claim:

1. A phase locked loop, comprising:
   a circuit for comparing a phase difference between an input signal and an oscillation output signal, having a phase difference output terminal outputting a phase difference output voltage;
   a low pass filter for removing high frequency components of said phase difference output voltage, outputting a filtered phase difference output voltage;
   a voltage controlled oscillator outputting said oscillation output signal having an oscillation frequency controlled in accordance with said filtered phase difference output voltage to thereby output said oscillation output signal in conformance with said input signal; and
   voltage means connected to said circuit for comparing and said low pass filter for supplying a voltage having a potential substantially equal to a potential of said filtered phase difference output voltage to said phase difference output terminal when said phase difference output terminal is in a non-conductive state.

2. The phase locked loop according to claim 1, wherein said low pass filter includes a capacitor for integrating the phase difference output voltage connected to said voltage means.

3. The phase locked loop according to claim 1, wherein:
   said voltage means comprises a capacitor for integrating the phase difference output voltage, connected to the phase difference output terminal of said circuit when the phase difference output terminal is in the non-conductive state to thereby supply said voltage having a potential substantially equal to the potential of said filtered phase difference output voltage.

4. The phase locked loop according to claim 1,
   wherein said circuit for comparing a phase difference comprises a phase comparing means for generating first and second phase difference comparison signals; and
   wherein the phase locked loop further comprises:
   a control circuit including an inverter element and a logical product element, said control circuit inputting said first and second phase difference comparison signals, said inverter element and said logical product element compare the first and second phase difference comparison signals and function to connect the phase difference output terminal to an output of said voltage means upon detecting when the phase difference output terminal is in non-conductive state.

5. A phase locked loop according to claim 2,
   wherein said circuit for comparing a phase difference comprises a phase comparing means for generating first and second phase difference comparison signals; and
   wherein said circuit for comparing a phase difference has a control circuit portion including an inverter element and a logical product circuit element receiving said first and second phase difference comparison signals as input signals, and said inverter element and said logical product circuit element of said control circuit portion compare the first and second phase difference comparison signals and function so as to connect said phase difference output terminal to an output of said voltage means upon detecting a period in which the phase difference output terminal is in the non-conductive state.

6. A phase locked loop according to claim 3,
   where said circuit for comparing a phase difference comparison and means for generating first and second phase difference comparison signals; and
   wherein said circuit for comparing a phase difference has a control circuit portion including an inverter element and a logical product circuit element receiving said first and second phase difference comparison signals as input signals, and said inverter element and said logical product circuit element of said control circuit portion compare the first and second phase difference comparison signals and function so as to connect said phase difference output terminal to an output of said voltage means upon detecting a period in which the phase difference output terminal is in the non-conductive state.

7. A semiconductor device having a phase locked loop formed on one semiconductor chip, comprising:
   a phase comparator for comparing a phase difference between an input signal and an oscillation output signal, having a phase difference output terminal outputting a phase difference output voltage;

a low pass filter for smoothing said phase difference output voltage, outputting a smoothed phase difference output voltage;

a voltage controlled oscillator outputting said oscillation output signal having an oscillation frequency controlled in accordance with said smoothed phase difference output voltage to thereby output said oscillation output signal in conformance with said input signal; and voltage means connected to said phase comparator and said low pass filter for supplying to said low pass filter a voltage having a potential substantially equal to a potential of said smoothed phase difference output voltage to said phase difference output terminal when said phase difference output terminal is in a non-conductive state.

8. A semiconductor device comprising:

a low pass filter for smoothing a phase difference output voltage, outputting a smoothed phase difference output voltage; and a semiconductor chip including a phase comparator for comparing a phase difference between an input signal and an oscillation output signal, having a phase difference output terminal outputting said phase difference output voltage;

a voltage controlled oscillator outputting said oscillation output signal having an oscillation frequency controlled in accordance with said smoothed phase difference output voltage to thereby output said oscillation output signal in conformance with said input signal; and voltage means connected to said phase comparator and said low pass filter for supplying to said low pass filter a voltage having a potential substantially equal to a potential of said smoothed phase difference output voltage to said phase difference output terminal when said phase difference output terminal is in a non-conductive state.

* * * * *